United States Patent
Hori et al.

(10) Patent No.: US 12,394,681 B2
(45) Date of Patent: Aug. 19, 2025

(54) SEMICONDUCTOR DEVICE

(71) Applicant: Fuji Electric Co., Ltd., Kanagawa (JP)

(72) Inventors: Motohito Hori, Nagano (JP); Yoshinari Ikeda, Nagano (JP); Akira Hirao, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 431 days.

(21) Appl. No.: 18/149,301

(22) Filed: Jan. 3, 2023

(65) Prior Publication Data

US 2023/0260859 A1  Aug. 17, 2023

(30) Foreign Application Priority Data

Feb. 14, 2022  (JP) .................. 2022-020332

(51) Int. Cl.
  *H01L 23/16* (2006.01)
  *H01L 23/40* (2006.01)
  *H01L 23/498* (2006.01)

(52) U.S. Cl.
  CPC ......... *H01L 23/16* (2013.01); *H01L 23/4006* (2013.01); *H01L 23/49811* (2013.01); *H01L 2023/4031* (2013.01); *H01L 2023/4087* (2013.01)

(58) Field of Classification Search
  CPC ................. H01L 23/16; H01L 23/4006; H01L 23/49811; H01L 2023/4031; H01L 2023/4087
  See application file for complete search history.

(56) References Cited

U.S. PATENT DOCUMENTS

| | | | | |
|---|---|---|---|---|
| 9,373,563 | B2* | 6/2016 | Stolze | H01L 23/04 |
| 2009/0261472 | A1* | 10/2009 | Bayerer | H01L 24/06 |
| | | | | 257/E23.101 |
| 2014/0035118 | A1* | 2/2014 | Bayerer | H01L 25/072 |
| | | | | 438/122 |
| 2016/0352244 | A1* | 12/2016 | Cheng | H01L 23/3735 |

FOREIGN PATENT DOCUMENTS

| JP | 2014-225571 A | 12/2014 |
|---|---|---|
| JP | 2021-150468 A | 9/2021 |

* cited by examiner

*Primary Examiner* — Peniel M Gumedzoe
(74) *Attorney, Agent, or Firm* — CHEN YOSHIMURA LLP

(57) ABSTRACT

A semiconductor device includes a semiconductor module that includes: an insulating circuit board, a semiconductor chip provided on a main surface of the insulating circuit board, and an external connection terminals provided on the main surface of the insulating circuit board; an external printed circuit board provided so as to face a main surface of the semiconductor module, the external printed circuit board having a through hole into which the external connection terminal is inserted; and an elastic member provided between the main surface of the semiconductor module and the external printed circuit board so as to apply a pressing force to the main surface of the semiconductor module.

14 Claims, 8 Drawing Sheets

SEMICONDUCTOR DEVICE

BACKGROUND OF THE INVENTION

Technical Field

The present invention relates to a semiconductor device incorporating a power semiconductor element.

Background Art

As a conventional semiconductor device, there is known a semiconductor module in which a power semiconductor chip (hereinafter simply referred to as a "semiconductor chip") constituting a power semiconductor element, such as a switching element for power conversion, is mounted on an insulating circuit board. When the semiconductor module 101 has a configuration in which both ends are screwed, fixing spring plates are attached to both ends of a case that accommodates the semiconductor chip and the insulating circuit board inside. The semiconductor module is fixed to a cooler via a compound by fastening the fixing spring plate to the cooler with screws and washers.

Patent Document 1 discloses a semiconductor module that includes a ceramic circuit board, a circuit pattern, and a sealing material, and that uses press-fit terminals as external connection terminals. Patent Document 2 discloses a configuration in which a spring holding bracket is arranged under a control circuit board, a leaf spring is arranged between the lower part of the spring holding bracket and the upper part of a semiconductor module, and the semiconductor module is pressed from above.

RELATED ART DOCUMENT

Patent Document

Patent Document 1: Japanese Patent Application Laid-Open Publication No, 2021-150468
Patent Document 2: Japanese Patent Application Laid-Open Publication No. 2014-225571

SUMMARY OF THE INVENTION

In a conventional semiconductor device, when a current is applied to a semiconductor module and constituent members expand due to the heat generated by the current flowing through the semiconductor chips and the members, because the case is fixed at both ends, the central portion of the case is deformed upward. As the case deforms, the center of the compound is also pulled upward. After that, when the current to the semiconductor module is cut off, heat generation ceases, the members shrink, and the deformation of the case returns to its original state. As the above phenomenon is repeated, the compound is gradually pushed out and flows out. Such a phenomenon is called pump-out. As a result, there is a problem that heat dissipation is deteriorated due to depletion of the compound, causing an increase in the temperature of the semiconductor chip.

In view of the above problems, an object of the present invention is to provide a semiconductor device capable of suppressing deformation of the semiconductor module when the current is turned on and off so as to reduce compound pump-out.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, comprising: a semiconductor module that includes: an insulating circuit board, a semiconductor chip provided on a main surface of the insulating circuit board, and an external connection terminals provided on the main surface of the insulating circuit board; an external printed circuit board provided so as to face a main surface of the semiconductor module, the external printed circuit board having a through hole into which the external connection terminal is inserted; and an elastic member provided between the main surface of the semiconductor module and the external printed circuit board so as to apply a pressing force to the main surface of the semiconductor module.

According to the present invention, it is possible to provide a semiconductor device capable of suppressing the deformation of the semiconductor module when the current is turned on and off, thereby reducing the pump-out of a compound when the semiconductor device is mounted on a cooler via the compound.

It is to be understood that both the foregoing general description and the following detailed description are exemplary and explanatory, and are intended to provide further explanation of the invention as claimed.

DETAILED DESCRIPTION OF EMBODIMENTS

Figure 1:
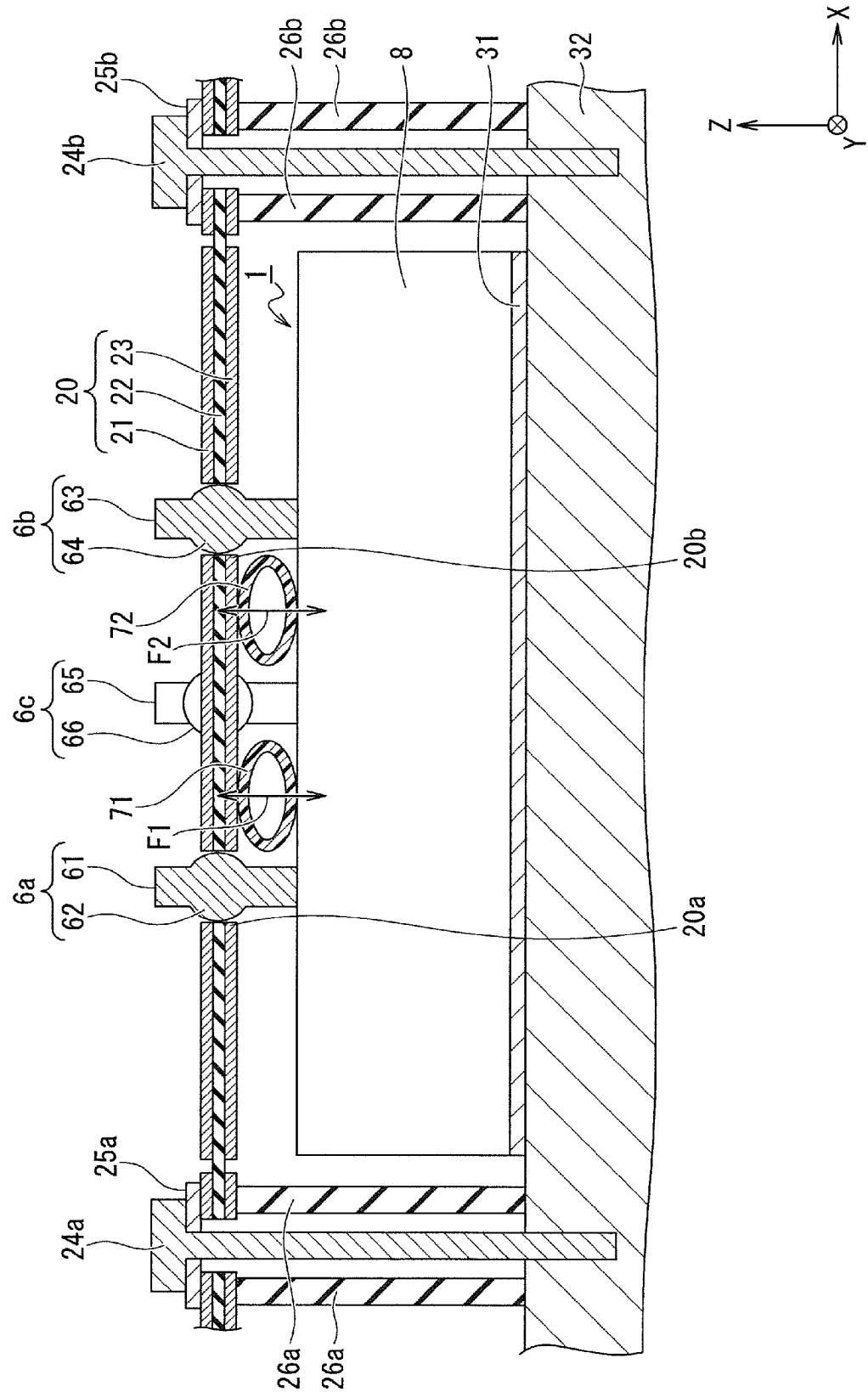
FIG. 1 is a schematic cross-sectional view of a semiconductor device according to an embodiment.

Embodiments will be described below with reference to the drawings. In the description of the drawings, the same or similar parts are denoted by the same or similar reference numerals, and overlapping descriptions are omitted. However, the drawings are schematic, and the relationship between the thickness and the planar dimensions, the ratio of the thickness of each layer, and the like may differ from the actual ones. In addition, portions having different dimensional relationships and ratios may also be included between drawings. Further, the embodiments shown below are examples of devices and methods for embodying the technical idea of the present invention, and the materials, shapes, structures, and arrangements, etc., of constituent elements are not particularly limited by these embodiments.

In the following description, the "first main electrode" of the semiconductor chip means either the source electrode or the drain electrode in the case of a field effect transistor (FET) or static induction transistor (SIT). In the case of an insulated gate bipolar transistor (IGBT), it means either the emitter electrode or the collector electrode. In static induction thyristors (SI thyristors), gate turn-off thyristors (GTO), and diodes, it means either the anode electrode or the cathode electrode. Further, the "second main electrode" of the semiconductor element means either one of the source electrode and the drain electrode, which are not the first main electrode, in the case of FET and SIT. In the case of an IGBT, it means either an emitter electrode or a collector electrode that does not serve as the first main electrode. In the case of SI thyristors, GTOs, and diodes, it means either the anode electrode or the cathode electrode, which does not serve as the first main electrode. That is, if the "first main electrode" is the source electrode, the "second main electrode" means the drain electrode. If the "first main electrode" is the emitter electrode, the "second main electrode" means the collector electrode. If the "first main electrode" is the anode electrode, the "second main electrode" means the cathode electrode.

In addition, the definitions of directions such as "up", "down", "up and down", "left", "right", "left and right" in the following description are merely definitions for convenience of explanation, and do not limit the technical idea of the present invention. For example, if the object is rotated by 90° and observed, "up and down" will be converted to "left and right", and if the object is rotated by 180° and observed, "up and down" will be reversed.

<Semiconductor Device Configuration>

FIG. 1 shows a schematic cross-sectional view of a semiconductor device according to an embodiment. In FIG. 1, illustration of components appearing in a cross section of a semiconductor module (power semiconductor module) 1 of a semiconductor device of the embodiment is omitted, and a side surface of a case 8 on the front side of the semiconductor module 1 is illustrated. In the cross-sectional view shown in FIG. 1, the horizontal direction in FIG. 1 is defined as the X-axis, and the rightward direction in FIG. 1 is defined as the positive direction of the X-axis. Further, the direction orthogonal to the X-axis, which is the direction toward the back side and the front side in FIG. 1, is defined as the Y-axis, and the back side in FIG. 1 is defined as the positive direction of the Y-axis. A direction orthogonal to the X-axis and the Y-axis, which are vertical directions in FIG. 1, is defined as the Z-axis, and the upward direction in FIG. 1 is defined as the positive direction of the Z-axis. The same applies to FIG. 2 and subsequent figures.

As shown in FIG. 1, the semiconductor device according to the embodiment includes a semiconductor module 1, an external printed circuit board 20 provided facing one main surface (upper surface) of the semiconductor module 1, elastic members 71 and 72 provided between the main surface of the semiconductor module 1 and the external printed circuit board 20, and a cooler (heat sink) 32 provided on the main surface (lower surface) opposite to one main surface of the semiconductor module 1 via a compound (bonding material) 31.

Figure 2:
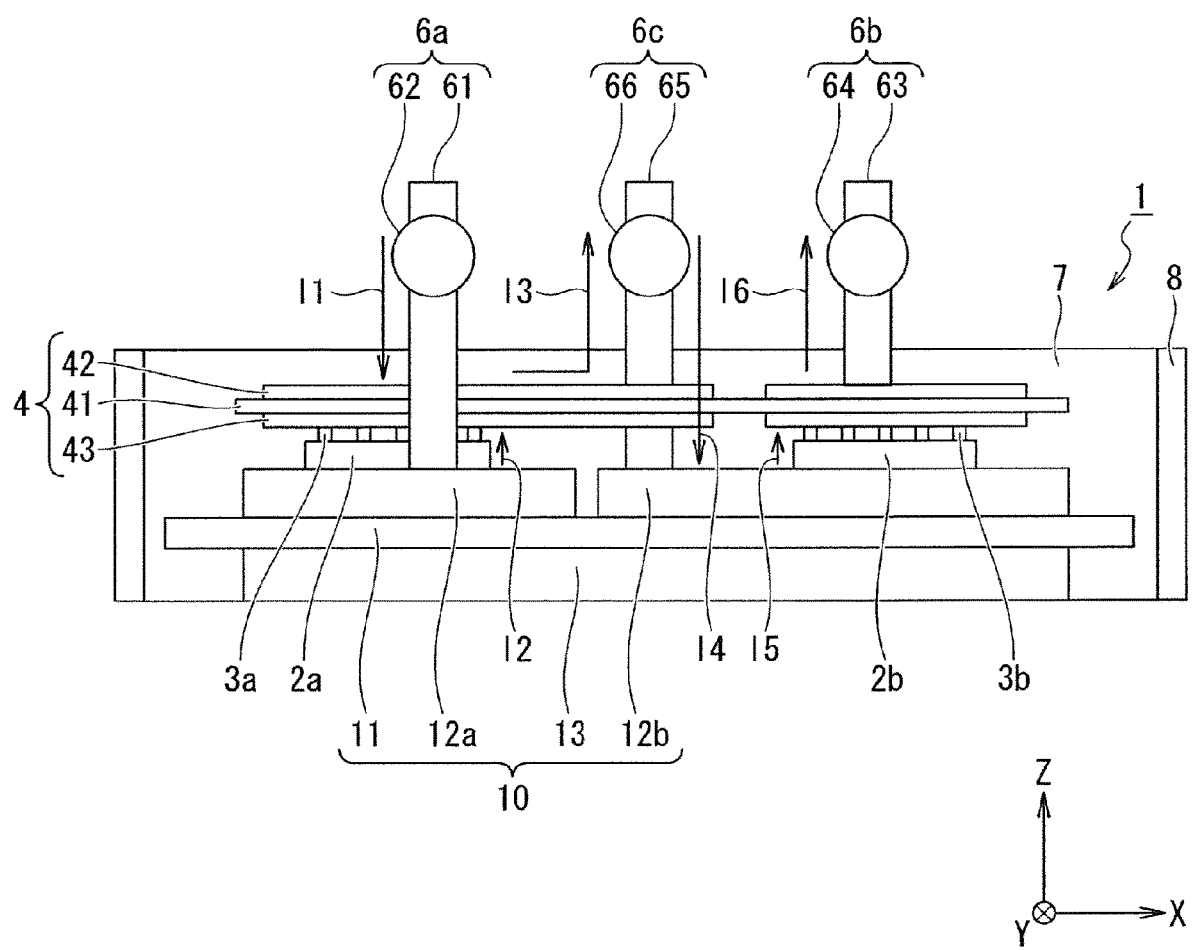
FIG. 2 is a side view of the semiconductor module according to the embodiment.

The semiconductor module 1 is a semiconductor module called "2 in 1" that has the functions of two power semiconductor elements. FIG. 2 is a side view of the semiconductor module 1. In FIG. 2, the sealing member 7 is transparently shown, and the illustration of the portion of the case 8 that covers the front side of the sealing member 7 is omitted.

As shown in FIG. 2, the semiconductor module 1 includes an insulating circuit board 10 and semiconductor chips 2a and 2b provided on one main surface (upper surface) of the insulating circuit board 10. An internal printed circuit board 4 is provided on the other main surface (upper surface) side opposite to the one main surface (lower surface) side facing the insulating circuit board 10 of the semiconductor chips 2a and 2b.

The insulating circuit board 10 has, for example, a rectangular planar shape. The insulating circuit board 10 includes an insulating substrate 11, upper conductor layers 12a and 12b provided on one main surface (upper surface) of the insulating substrate 11, and a lower conductor layer 13 provided on the other main surface (lower surface) of the insulating substrate 11. The insulating circuit board 10 may be, for example, a direct copper bond (DCB) board, an active braze (AMB) board, or the like. The insulating substrate 11 is composed of, for example, a ceramic substrate made of aluminum oxide ($Al_2O_3$), aluminum nitride (AlN), silicon nitride ($Si_3N_4$), boron nitride (BN), or the like, or a resin insulating substrate using a polymer material or the like. The upper conductor layers 12a and 12b and the lower conductor layer 13 are made of conductor foil made of, for example, copper (Cu) or aluminum (Al). A predetermined circuit pattern is formed on the upper conductor layers 12a and 12b.

The semiconductor chips 2a and 2b may be made of, for example, a silicon (Si) material, or may be made of a wide bandgap semiconductor material such as silicon carbide (SiC), gallium nitride (GaN), or gallium oxide ($Ga_2O_3$). The types of the semiconductor chips 2a and 2b differ depending on the application, but for example, a power semiconductor element, such as metal oxide semiconductor field effect transistors (MOSFETs), insulated gate bipolar transistors (IGBTs), static induction (SI) thyristors, gate turn-off (GTO) thyristors, and the like, a rectifying element such as a freewheeling diode (FWD), or the like can be employed. Here, a case will be described where the semiconductor chips 2a and 2b are SiC MOSFETs, the semiconductor chip 2a is the semiconductor chip on the upper arm side, and the semiconductor chip 2b is the semiconductor chip on the lower arm side.

FIG. 2 illustrates a case where the semiconductor module 1 has a single semiconductor chips 2a and a single semiconductor chip 2b as semiconductor chips on the upper arm side and the lower arm side, respectively. But the number of the semiconductor chips are not limited, and can be selected as appropriate. For example, the semiconductor module 1 may have two or more semiconductor chips each for the upper arm side and the lower arm side.

The semiconductor chips 2a and 2b each have a first main electrode (drain electrode) on the lower surface side, and a control electrode (gate electrode) and a second main electrode (source electrode) on the upper surface side. The drain electrode of the semiconductor chip 2a is directly bonded to the upper conductor layer 12a of the insulating circuit board 10 via a bonding material (not shown) such as solder or sintered material, or directly using a direct bonding technique. The drain electrode of the semiconductor chip 2b is directly bonded to the upper conductor layer 12b of the insulating circuit board 10 via a bonding material such as solder or sintered material, or directly using a direct joining technique.

The semiconductor chips 2a, 2b are electrically connected to the internal printed circuit board 4 via a plurality of bumps (post electrodes) 3a, 3b. The source electrode of the semiconductor chip 2a is joined to one or more of the plurality of bumps 3a via a joining material (not shown) such as solder or sintered material. The gate electrode of the semiconductor chip 2a is joined to another one or more of the plurality of bumps 3a via a joining material (not shown) such as solder or sintered material. The source electrode of the semiconductor chip 2b is joined to one or more of the plurality of bumps 3b via a joining material (not shown) such as solder or sintered material. The gate electrode of the semiconductor chip 2b is joined to another one or more of the plurality of bumps 3b via a joining material (not shown) such as solder or sintered material.

The bumps 3a and 3b are, for example, rod-shaped, pin-shaped, or column-shaped, and specifically may be circular columns, elliptical columns, or polygonal columns such as, triangular columns, or square columns. Metal materials such as copper (Cu) can be used as materials for the bumps 3a and 3b. The bumps 3a and 3b may be bonded to the lower wiring layer 43 of the internal printed circuit board 4 or may be bonded to the upper wiring layer 42 through the internal printed circuit board 4. The bumps 3a and 3b may be, for example, stud bumps made of gold (Au) or the like, or pillar electrodes or ball-shaped electrodes using various metal materials such as solder, metal sintered bodies such as nano-silver (Ag) paste, or the like.

The internal printed circuit board 4 includes an insulating layer 41, an upper wiring layer 42 provided on one main surface (upper surface) of the insulating layer 41, and a lower wiring layer 43 provided on the other main surface (lower surface) of the insulating layer 41. For example, the insulating layer 41 is made of a resin substrate made of polyimide resin, a combination of glass fiber and polyimide resin, or the like. The upper wiring layer 42 and the lower wiring layer 43 are made of conductor foil made of, for example, copper (Cu) or aluminum (Al). A predetermined circuit pattern is formed on the upper wiring layer 42 and the lower wiring layer 43. For example, the same circuit pattern may be formed on the upper wiring layer 42 and the lower wiring layer 43. The upper wiring layer 42 and the lower wiring layer 43 may be electrically connected to each other via a through hole penetrating the insulating layer 41.

The lower end of the drain-side connection terminal 6a, which is an external connection terminal for the main wiring on the positive electrode side, is joined to the upper conductor layer 12a of the insulating circuit board 10 via a joining material (not shown) such as solder or sintered material. The drain-side connection terminal 6a extends upward from the insulating circuit board 10. The drain-side connection terminal 6a is made of a metal material such as copper (Cu). The drain-side connection terminal 6a supplies current to the drain electrode of the semiconductor chip 2a through the upper conductor layer 12a of the insulating circuit board 10.

To the upper wiring layer 42 of the internal printed circuit board 4, the lower end of the source-side connection terminal 6b, which is an external connection terminal for the main wiring on the negative electrode side, is joined via a joining material (not shown) such as solder or sintered material. The source-side connection terminal 6b extends upward from the internal printed circuit board 4. The source-side connection terminal 6b is made of a metal material such as copper (Cu). The source-side connection terminal 6b allows current from the source electrode of the semiconductor chip 2b to flow through the bumps 3b and the internal printed circuit board 4 to the external printed circuit board 20 shown in FIG. 1.

The lower end of the output terminal 6c, which is an external connection terminal for the main wiring on the output side, is joined to the upper conductor layer 12b of the insulating circuit board 10 via a joining material (not shown) such as solder or sintered material. The output terminal 6c extends upward from the insulating circuit board 10 and penetrates the internal printed circuit board 4. The output terminal 6c is electrically connected to the upper wiring layer 42 and the lower wiring layer 43 of the internal printed circuit board 4. The output terminal 6c is made of a metal material such as copper (Cu). The output terminal 6c allows current from the source electrode of the semiconductor chip 2a to flow through the bumps 3a and the internal printed circuit board 4 to the external printed circuit board 20 shown in FIG. 1 when the semiconductor chip 2a is ON. The output terminal 6c supplies current from the external printed circuit board 20 shown in FIG. 1 to the drain electrode of the semiconductor chip 2b through the upper conductor layer 12b of the insulating circuit board 10 when the semiconductor chip 2b is ON.

Although not shown in FIG. 2, the internal printed circuit board 4 is electrically connected to a plurality of gate control terminals, which are external connection terminals for gate control. Respective gate control terminals apply control signals for controlling ON/OFF of the semiconductor chips 2a and 2b to the gate electrodes of the semiconductor chips 2a and 2b via the internal printed circuit board 4 and the bumps 3a and 3b, respectively.

The insulating circuit board 10, the semiconductor chips 2a and 2b, the bumps 3a and the internal printed circuit board 4 are sealed with a sealing member 7. As the sealing member 7, for example, a resin material such as a hard thermosetting resin having high heat resistance can be used. Specifically, an epoxy resin, a maleimide resin, a cyanate resin, or the like can be used. The lower conductor layer 13 of the insulating circuit board 10 is exposed on the lower surface side of the sealing member 7.

The upper portions of the drain-side connection terminal 6a, the source-side connection terminal 6b, and the output terminal 6c protrude from the upper surface side of the sealing member 7. The drain-side connection terminal 6a, the source-side connection terminal 6b, and the output terminal 6c are configured as press-fit terminals. The drain-side connection terminal 6a has a main portion 61 and a projecting portion (thick portion) 62 thicker than the main portion 61. The source-side connection terminal 6b has a main portion 63 and a projecting portion 64 thicker than the main portion 63. The output terminal 6c has a main portion 65 and a projecting portion 66 thicker than the main portion 65. The plurality of gate control terminals, not shown in FIG. 2, are also press-fit terminals.

A case 8 is provided for housing the semiconductor chips 2a and 2b, the internal printed circuit board 4, and the sealing member 7 inside. The case 8 is made of thermoplastic resin such as polyphenylene sulfide (PSS), polybutylene terephthalate (PBT), polybutylene succinate (PBS), polyamide, acrylonitrile butadiene styrene (ABS). The case 8 is provided so as to surround the side surfaces of the sealing member 7.

The outer shape of the sealing member 7 and the case 8 constitutes the outer shape of the semiconductor module 1 and has a substantially rectangular parallelepiped shape. The upper surfaces of the sealing member 7 and the case 8 correspond to the upper surface of the semiconductor module 1, and the lower surfaces of the sealing member 7 and the case 8 correspond to the lower surface of the semiconductor module 1. The case 8 may have not only the side wall portion covering the side surfaces of the sealing member 7 but also the lid portion covering the upper surface of the sealing member 7. In this case, the upper surface of case 8 corresponds to the upper surface of semiconductor module 1. Openings are provided in the lid of the case 8, and the drain-side connection terminal 6a, the source-side connection terminal 6b, and the output terminal 6c pass through the openings of the lid.

As shown in FIG. 1, the lower surface side of the semiconductor module 1 is joined to the cooler 32 via the compound 31. The compound 31 is composed of, for example, a thermal interface material (TIM) or the like. Thermally conductive materials such as thermally conductive greases, elastomer sheets, room temperature vulcanizing (RTV) rubbers, gels, phase change materials, solders, and silver solders can be used as the TIM. The cooler 32 is made of a metal material such as aluminum (Al).

An external printed circuit board 20 is provided facing the upper surface side of the semiconductor module 1. The external printed circuit board 20 has, for example, a rectangular planar shape. The external printed circuit board 20 includes an insulating layer 21, an upper wiring layer 22 arranged on the upper surface of the insulating layer 21, and a lower wiring layer 23 arranged on the lower surface of the insulating layer 21. For example, the insulating layer 21 is made of a resin substrate made of polyimide resin or a combination of glass fiber and polyimide resin, or the like. The upper wiring layer 22 and the lower wiring layer 23 are made of conductor foil made of, for example, copper (Cu) or aluminum (Al). A predetermined circuit pattern is formed on the upper wiring layer 22 and the lower wiring layer 23.

The external printed circuit board 20 is provided with a plurality of through holes (through holes) 20a and 20b penetrating the external printed circuit board 20. The projecting portion 62 of the drain-side connection terminal 6a is press-fitted (press-contacted) into and jointed to the through-hole 20a of the external printed circuit board 20 so as to be electrically connected to at least one of the upper wiring layer 22 and the lower wiring layer 23. The projecting portion 64 of the source-side connection terminal 6b is press-fitted into and jointed to the through-hole 20b of the external printed circuit board 20 so as to be electrically connected to at least one of the upper wiring layer 22 and the lower wiring layer 23. The projecting portion 66 of the output terminal 6c positioned on a rear side with respect to the drain-side connection terminal 6a and the source-side connection terminal 6b is press-fitted into and jointed to a through-hole (not shown) of the external printed circuit board 20 so as to be electrically connected to at least one of the lower wiring layers 23 and the lower wiring layer 23.

Elastic members 71 and 72 are provided between the upper surface of the semiconductor module 1 and the external printed circuit board 20. The outer peripheral surfaces of the elastic members 71 and 72 are in contact with the upper surface of the semiconductor module 1 and one main surface (lower surface) of the external printed circuit board 20. The elastic members 71 and 72 are provided apart from the drain-side connection terminal 6a, the source-side connection terminal 6b and the output terminal 6c. The elastic members 71 and 72 may be in contact with at least one of the drain-side connection terminal 6a, the source-side connection terminal 6b, and the output terminal 6c. The elastic member 71 is provided between the drain-side connection terminal 6a and the output terminal 6c. The elastic member 72 is provided between the output terminal 6c and the source-side connection terminal 6b.

FIG. 1 illustrates a case where the elastic members 71 and 72 are circular-cylindrical, but they may be cylindrical other than circular-cylindrical, columnar such as circular-columnar or prismatic columnar, or may be dot-shaped or a hollow ball shape. The elastic members 71 and 72 are composed of elastic and insulating members. As the material of the elastic members 71 and 72, for example, an elastomer such as silicon rubber, fluororubber, or urethane rubber can be used.

In FIG. 1, the elastic members 71 and 72 are sandwiched between the semiconductor module 1 and the external printed circuit board 20 and are elastically deformed, and the cross-sectional shapes of the elastic members 71 and 72 are elliptic due to the elastic deformation. As schematically indicated by the arrows in FIG. 1, the elastic members 71 and 72 apply pressing forces F1 and F2 due to elastic force to the upper surface of the sealing member 7, which is the upper surface of the semiconductor module 1. As a result, the semiconductor module 1 is pressed against the cooler 32 via the compound 31 so as to radiate heat. The elastic members 71 and 72 may be fixed in position by the pressing forces F1 and F2, or may be adhered to the upper surface of the semiconductor module 1 and the lower surface of the external printed circuit board 20 with an adhesive or the like.

Figure 3:
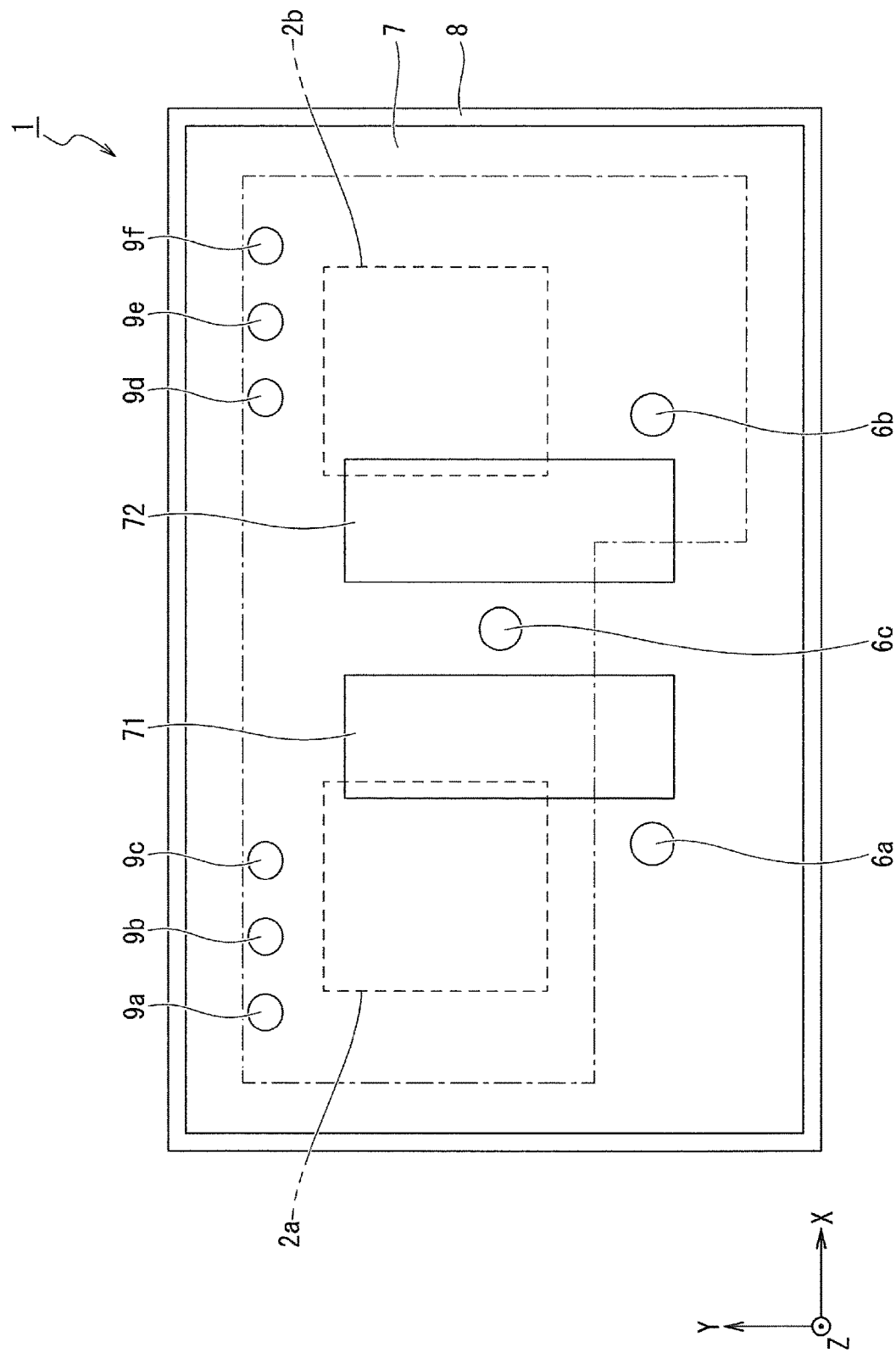
FIG. 3 is a plan view of the semiconductor module and elastic members according to the embodiment.

A plan view of the semiconductor module 1 and elastic members 71 and 72 shown in FIG. 1 is shown in FIG. 3. In FIG. 3, outlines of planar patterns of the semiconductor chips 2a and 2b incorporated in the semiconductor module 1 are schematically shown by dashed lines. Also, the outer shape of the planar pattern of the internal printed circuit board 4 incorporated in the semiconductor module 1 is schematically shown by the one dot chain line. FIG. 3 also shows gate control terminals 9a to 9f electrically connected to the gate electrodes of the semiconductor chips 2a and 2b, respectively, through the internal printed circuit board 4. Each of the drain-side connection terminal 6a, the source-side connection terminal 6b, the output terminal 6c, and the gate control terminals 9a to 9f is a press-fit terminal, which is schematically illustrated as a circle in FIG. 3. Some of the gate control terminals 9a to 9f may constitute auxiliary source terminals for detecting currents on the source sides of the semiconductor chips 2a and 2b.

As shown in FIG. 3, the semiconductor module 1 has a substantially rectangular planar shape. The horizontal direction of the X-axis in FIG. 3 is the longitudinal direction of the semiconductor module 1, and the vertical direction of the Y-axis in FIG. 3 is the transverse direction of the semiconductor module 1.

The output terminal 6c is provided substantially at the center of the semiconductor module 1. The drain-side connection terminal 6a and the source-side connection terminal 6b are arranged side by side at positions in the longitudinal direction of the semiconductor module 1 different from the position of the output terminal 6c. The gate control terminals 9a to 9f are arranged in a row in the longitudinal direction of the semiconductor module 1 on the opposite side of the output terminal 6c from the drain-side connection terminal 6a and the source-side connection terminal 6b. The arrangement positions of the drain-side connection terminal 6a, the source-side connection terminal 6b, the output terminal 6c, and the gate control terminals 9a to 9f are not particularly limited.

The elastic members 71 and 72 are provided substantially in the center of the semiconductor module 1 in the longitudinal direction. The elastic members 71 and 72 are provided so as to extend parallel to the transverse direction of the semiconductor module 1 with the output terminal 6c interposed therebetween. The number of elastic members 71 and 72 is not limited, and either one of the elastic members 71 and 72 may be provided, or three or more elastic members may be provided. The elastic members 71 and 72 may be provided so as to extend parallel to the longitudinal direction of the semiconductor module 1 with the output terminal 6c interposed therebetween. The elastic member may be ring-shaped so as to surround the output terminal 6c.

As shown in FIG. 1, the external printed circuit board 20 is fixed to the cooler 32 by fixing portions (24a, 25a, 26a), (24b, 25b, 26b) at both ends in the longitudinal direction of the semiconductor module 1. The fixed portions (24a, 25a, 26a), (24b, 25b, 26b) may be arranged at the four corners of the rectangular planar shape of the external printed circuit board 20.

The fixing portion (24a, 25a, 26a) comprises screws 24a, a washer 25a and spacers 26a. The screw 24a is fastened to the cooler 32 via the washer 25a and the spacers 26a. The fixing portion (24b, 25b, 26b) comprises a screw 24b, a washer 25b and spacers 26b. The screw 24b is fastened to the cooler 32 via the washer 25b and the spacers 26b.

Next, the operation of the semiconductor module 1 of the semiconductor device according to the embodiment when the current is turned on will be described. Through the gate control terminals 9a to 9f shown in FIG. 3, control signals for controlling the on/off of the semiconductor chips 2a and 2b shown in FIG. 2 are applied to the gate electrodes of the semiconductor chips 2a and 2b via the internal printed circuit board 4 and bumps 3a, 3b, so as to perform alternate switching operations of the semiconductor chips 2a and 2b.

The arrows I1 to I6 in FIG. 2 schematically indicate current paths in the semiconductor module 1. A current (arrow I1) entering from the drain-side connection terminal 6a passes through the upper conductor layer 12a of the insulating circuit board 10, flows through the semiconductor chip 2a on the upper arm side to the bumps 3a (arrow I2), flows through the internal printed circuit board 4, and flows through the output terminal 6c to the external printed circuit board 20 (arrow I3). Next, a current (arrow I4) that enters the output terminal 6c from the external printed circuit board 20 passes through the upper conductor layer 12b of the insulating circuit board 10, flows through the semiconductor chip 2b on the lower arm side to the bumps 3b (arrow I5), flows through the internal printed circuit board 4, and flows through the source-side connection terminal 6b to the external printed circuit board 20 (arrow I6).

Figure 4:
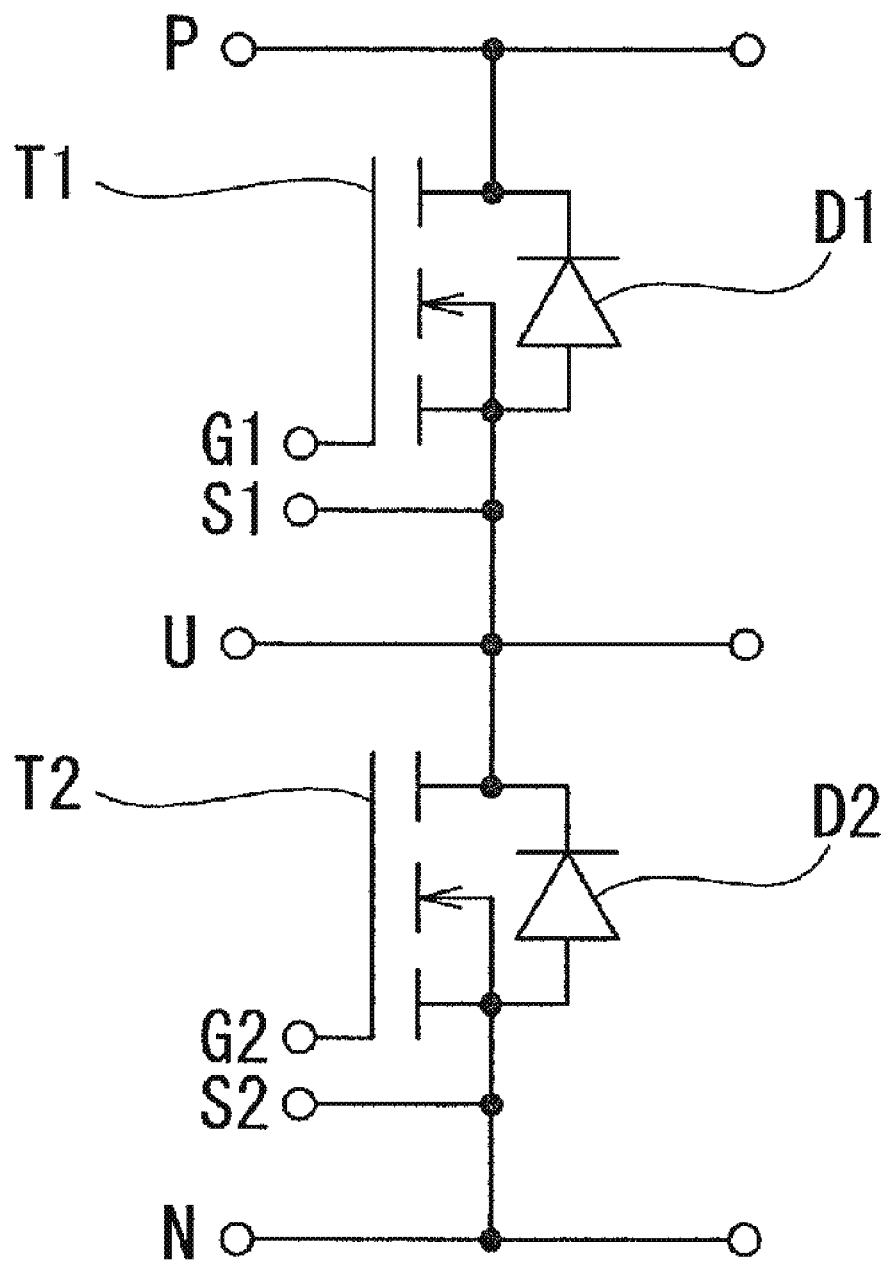
FIG. 4 is an equivalent circuit diagram of the semiconductor module according to the embodiment.

Next, FIG. 4 shows an example of an equivalent circuit of the semiconductor module 1 of the semiconductor device according to the embodiment. As shown in FIG. 4, the semiconductor module 1 forms part of a three-phase bridge circuit. The drain-side connection terminal P is connected to the second main electrode (drain electrode) of the transistor T1 on the upper arm side, and the source-side connection terminal N is connected to the first main electrode (source electrode) of the transistor T2 on the lower arm side. The source electrode of the transistor T1 and the drain electrode of the transistor T2 are connected to an output terminal U and an auxiliary source terminal S1. An auxiliary source terminal S2 is connected to the source electrode of the transistor T2. Gate control terminals G1 and G2 are connected to the gate electrodes of the transistors T1 and T2, respectively. In the transistors T1 and T2, body diodes D1 and D2 serving as freewheeling diodes (FWD) are respectively connected in anti-parallel and incorporated.

The drain-side connection terminal P, the source-side connection terminal N, and the output terminal U shown in FIG. 4 correspond to the drain-side connection terminal 6a, the source-side connection terminal 6b, and the output terminal 6c shown in FIG. 1, respectively. The transistors T1 and T2 shown in FIG. 4 correspond to the semiconductor chips 2a and 2b shown in FIG. 1, respectively. The gate control terminals G1, G2 and the auxiliary source terminals S1, S2 shown in FIG. 4 correspond to the gate control terminals 9a-9f shown in FIG. 3.

<Manufacturing Method of Semiconductor Device>

Next, an example of the manufacturing method (assembling method) of the semiconductor device according to the embodiment will be described. The insulating circuit board 10 shown in FIG. 2 is prepared, and the semiconductor chips 2a and 2b are mounted on the upper surfaces of the upper conductor layers 12a and 12b of the insulating circuit board 10 via a bonding material. Next, the bumps 3a and 3b are mounted on the upper surfaces of the semiconductor chips 2a and 2b via a bonding material, and the internal printed circuit board 4 is mounted on the bumps 3a and 3b via a bonding material.

Next, the lower ends of the drain-side connection terminal 6a and the output terminal 6c are mounted on the upper surfaces of the upper conductor layers 12a and 12b, respectively, of the insulating circuit board 10 via a bonding material, and the lower end of the source-side connection terminal 6b is mounted on the upper surface of the upper wiring layer 42 of the internal printed circuit board 4 via a bonding material. The gate control terminals 9a to 9f shown in FIG. 3 are also mounted on the upper surface of the upper wiring layer 42 of the internal printed circuit board 4 via a bonding material. Next, by heat treatment, the insulating circuit board 10, the semiconductor chips 2a and 2b, the bumps 3a and 3b, the internal printed circuit board 4, the drain-side connection terminal 6a, the source-side connection terminal 6b, the output terminal 6c, and the gate control terminals 9a to 9f are joined with each other.

Next, the insulating circuit board 10, the semiconductor chips 2a and 2b, the bumps 3a and 3b, and the internal printed circuit board 4 are arranged inside the case 8. The inside of the case 8 is filled with the sealing member 7, and the insulating circuit board 10, the semiconductor chips 2a and 2b, the bumps 3a and 3b, and the internal printed circuit board 4 are sealed with the sealing member 7. Upper portions of the drain-side connection terminal 6a, the source-side connection terminal 6b, the output terminal 6c, and the gate control terminals 9a to 9f protrude from the upper surface side of the sealing member. As a result, the semiconductor module 1 is completed.

Figure 5:
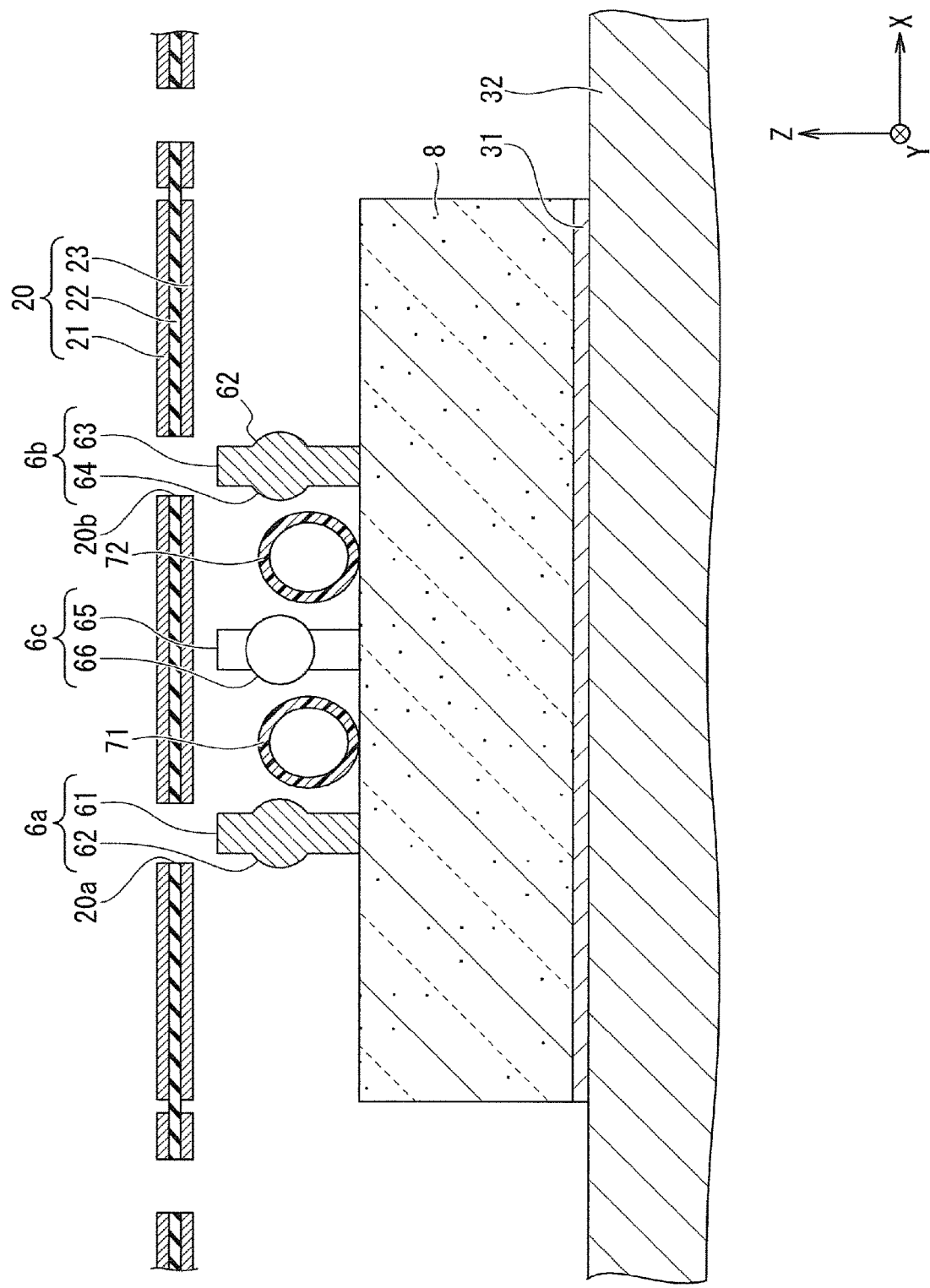
FIG. 5 is a schematic cross-sectional view for explaining a method of assembling the semiconductor device according to the embodiment.

Next, elastic members 71 and 72 are placed on the upper surface of the semiconductor module 1 as shown in FIG. 5. Also, the external printed circuit board 20 is prepared, and arranged above and aligned with the semiconductor module 1. Then, as shown in FIG. 1, the external printed circuit board 20 is fastened and fixed to the cooler 32 by the fixing portions (24a, 25a, 26a), (24b, 25b, 26b) so that the drain-side connection terminal 6a and the source-side connection terminal 6b are press-fitted into the through holes 20a and 20b, respectively, of the external printed circuit board 20 and that the output terminal 6c and the gate control terminals 9a to 9f are press-fitted into other through holes (not shown) of the external printed circuit board 20. At this time, the elastic members 71 and 72 are sandwiched between the semiconductor module 1 and the external printed circuit board 20 and are elastically deformed. Thus, the semiconductor device according to the embodiment is completed.

Instead of placing the elastic members 71 and 72 on the upper surface of the semiconductor module 1 in advance and elastically deforming the elastic members 71 and 72 when fixing the external printed circuit board 20 to the cooler 32, the external printed circuit board 20 may be fixed to the cooler 32, and the elastic members 71 and 72 may be inserted between the external printed circuit board 20 and the semiconductor module 1 in a state of being elastically deformed.

Comparative Example

Figure 6:
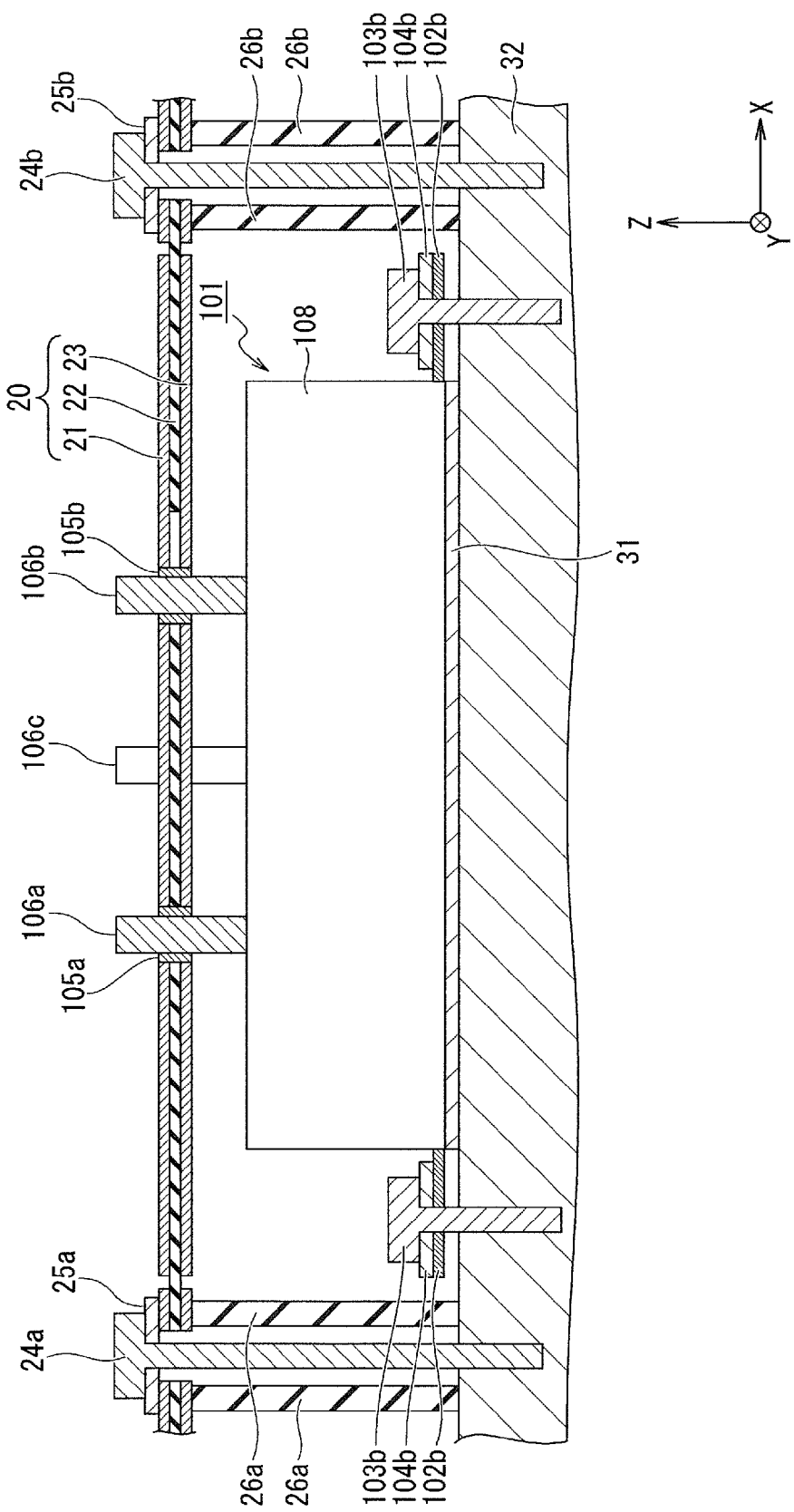
FIG. 6 is a schematic cross-sectional view of a semiconductor device according to a comparative example.
Figure 7:
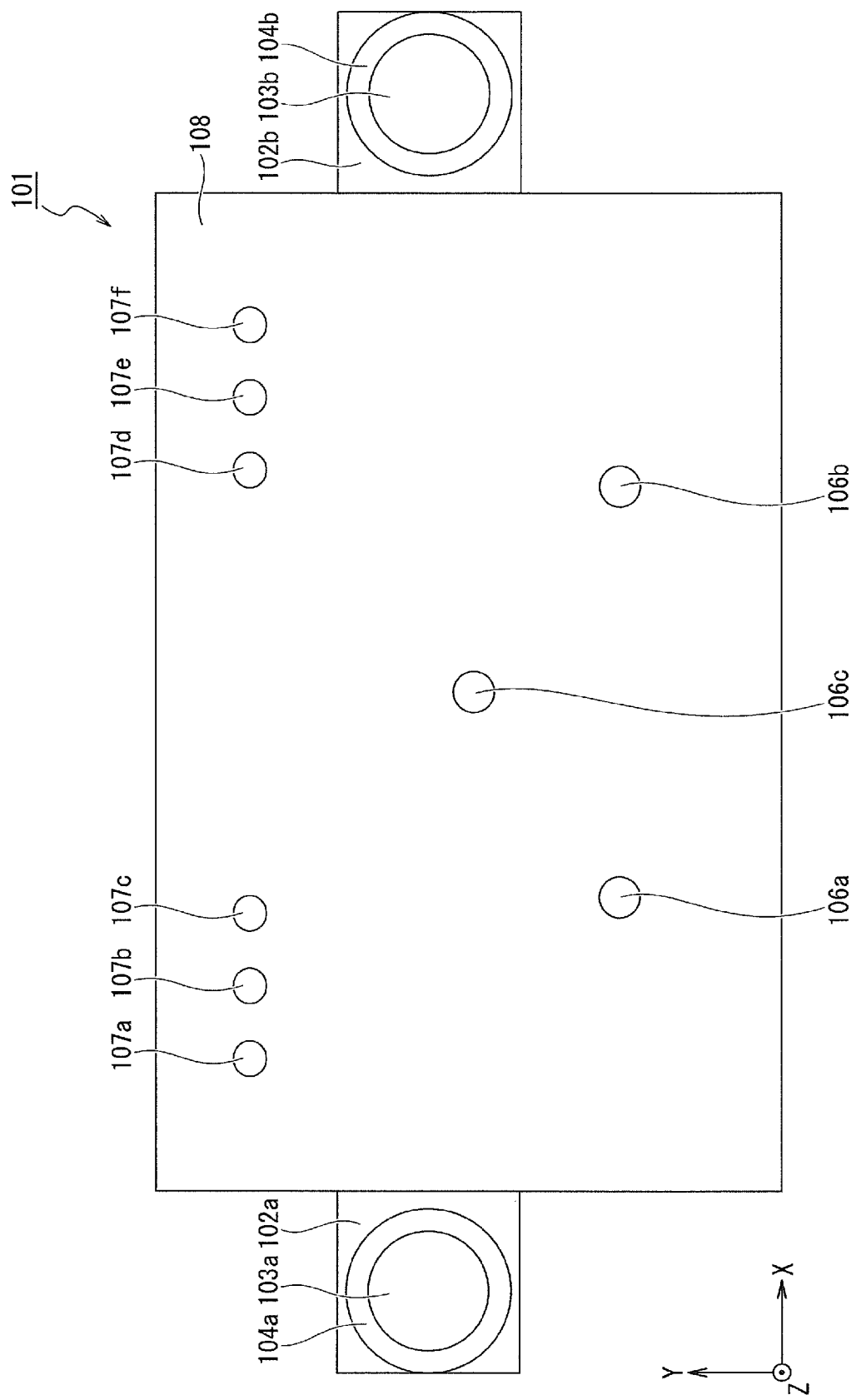
FIG. 7 is a plan view of a semiconductor module according to the comparative example.
Figure 8:
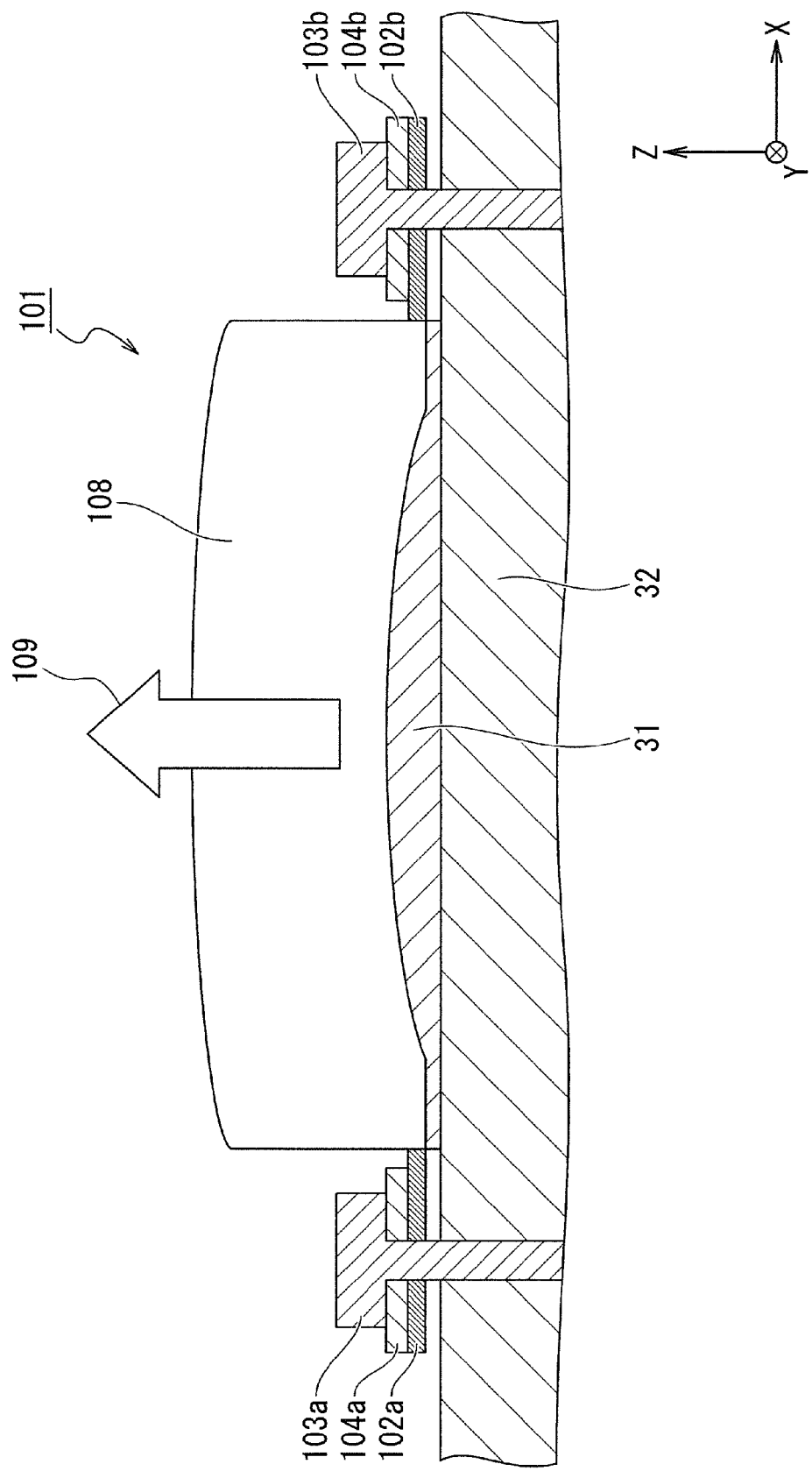
FIG. 8 is a schematic cross-sectional view of the semiconductor module according to the comparative example when deformed.

Here, a semiconductor device according to a comparative example will be described with reference to FIGS. 6 to 8. FIG. 6 is a schematic cross-sectional view of a semiconductor device according to the comparative example, and FIG. 7 is a plan view of only a semiconductor module 101 of the semiconductor device according to the comparative example. In FIG. 6, illustration of components appearing in the cross section of the semiconductor module 101 is omitted, and the side surface of the case 108 on the front side of the semiconductor module 101 is illustrated. As shown in FIG. 6, the semiconductor device according to the comparative example differs from the semiconductor device according to the embodiment in that there is no elastic member between the external printed circuit board 20 and the semiconductor module 101.

Furthermore, as shown in FIGS. 6 and 7, the semiconductor device according to the comparative example differs from the semiconductor device according to the embodiment in that the semiconductor module 101 is screwed at both ends. Fixing spring plates 102a and 102b are attached to the respective ends of the case 108 of the semiconductor module 101. The fixing spring plates 102a and 102b are fixed to the cooler 32 by screws 104a and 104b via washers 103a and 103b, respectively.

Further, in the semiconductor device according to the comparative example, as shown in FIGS. 6 and 7, the drain-side connection terminal 106a, the source-side connection terminal 106b, the output terminal 106c, and the gate control terminals 107a to 107f are not press-fit terminals, but are terminals having a constant thickness. As shown in FIG. 6, the drain-side connection terminal 106a and the source-side connection terminal 106b are joined to the external printed circuit board 20 via solders 105a and 105b, respectively. The output terminal 106c and the gate control terminals 107a to 107f are similarly joined to the external printed circuit board 20 via solders (not shown).

In the semiconductor device according to the comparative example, since the semiconductor module 101 has a configuration in which both ends are screwed, pump-out is likely to occur. That is, when an electric current is applied to the semiconductor module 101 and the semiconductor chips and members contained in the semiconductor module 101 expand due to the heat generated by the electric current flowing through them, because the case 108 is fixed at both ends, as indicated schematically by the arrow 109 in FIG. 8, the central portion of the case 108 is deformed upward. As the case 108 deforms, the compound 31 is also pulled upward at its central portion. After that, the current in the semiconductor module 101 is turned off, the heat is no longer generated, the member shrinks, and the deformation of the case 108 returns to its original state. By repeating the this phenomenon, the compound 31 is gradually pushed out and flows out. As a result, the compound 31 is depleted, deteriorating the heat dissipation and increasing the temperature of the semiconductor chip.

Effect

On the other hand, according to the semiconductor device according to the embodiment, by inserting the elastic members 71 and 72 between the external printed circuit board 20 and the semiconductor module 1, the central pressing forces F1 and F2 are directly transmitted to the semiconductor module 1, and the semiconductor module 1 is pressed against the cooler 32 via the compound 31 with a stronger force. As a result, deformation of the semiconductor module 1 that would be caused when the current of the semiconductor module 1 is turned on and off can be suppressed, and pump-out can be reduced.

Furthermore, according to the semiconductor device according to the embodiment, the elastic members 71 and 72 press the semiconductor module 1 through the compound 31 against the cooler 32 with a strong force. Therefore, it becomes unnecessary to fix the case 108 of the semiconductor module 101 to the cooler 32 using the fixing spring plates 102a, 102b, the washers 103a, 103b, and the screws 104a, 104b at both ends of the case 108 as in the semiconductor device of the comparative example shown in FIGS. 6 and 7. Therefore, compared with the semiconductor device of the comparative example, the space for arranging the fixing spring plates 102a and 102b, the washers 103a and 103b, and the screws 104a and 104b can be eliminated, and the semiconductor device of the embodiment can be miniaturized to that extent. Moreover, since the semiconductor module 1 can be freely deformed in the lateral direction when the current of the semiconductor module 1 is turned on or off, the upward deformation of the semiconductor module 1 can be suppressed.

Furthermore, according to the semiconductor device according to the embodiment, the drain-side connection terminal 6a, the source-side connection terminal 6b, the output terminal 6c, and the gate control terminals 9a to 9f are configured as press-fit terminals. As a result, even if the drain-side connection terminal 6a, the source-side connection terminal 6b, the output terminal 6c, and the gate control terminals 9a to 9f move upward as the semiconductor module 1 deforms upward when the semiconductor module 1 is turned on and off, the drain-side connection terminal 6a, the source-side connection terminal 6b, the output terminal 6c, and the gate control terminals 9a to 9f can slide up and down inside the corresponding through holes (20a, 20b and the others) of the external printed circuit board 20. Therefore, the vertical movement of the external printed circuit board 20 can be suppressed, and the pressing forces F1 and F2 by the elastic members 71 and 72 can be maintained.

Furthermore, by forming the drain-side connection terminal 6a, the source-side connection terminal 6b, the output terminal 6c, and the gate control terminals 9a to 9f as press-fit terminals, when the elastic members 71 and 72 are pressed and elastically deformed by the external printed circuit board 20 after the elastic members 71 and 72 are placed on the upper surface of the semiconductor module 1 during the assembly of the semiconductor device of the embodiment, the external printed circuit board 20 can be vertically moved by adjusting the degree of tightening the fixing portions (24a, 25a, 26a) and (24b, 25b, 26b). This way, the elastic deformation amounts of the elastic members 71 and 72 and the pressing forces F1 and F2 can be adjusted.

Other Embodiments

As described above, the present invention has been described with reference to embodiments, but the statements and drawings forming part of this disclosure should not be understood to limit the present invention. Various alternative embodiments, implementations and operational techniques will become apparent to those skilled in the art from this disclosure.

For example, as the semiconductor module 1 of the semiconductor device according to the embodiment, a "2-in-1" configuration having the functions of two power semiconductor elements has been exemplified. However, the present invention is applicable to a "1 in 1" configuration. Further, the semiconductor device according to the embodiment may have a plurality of semiconductor modules 1. For example, three semiconductor modules 1 may be arranged side by side to form a "6-in-1" configuration.

Further, in the embodiment above, the drain-side connection terminal 6a, the source-side connection terminal 6b, the output terminal 6c, and the gate control terminals 9a to 9f are press-fit terminals. But the drain-side connection terminal 6a and the source-side connection terminal 6b, the output terminal 6c, and the gate control terminals 9a to 9f may be terminals having a constant thickness instead of press-fit terminals. In this case, the drain-side connection terminal 6a, the source-side connection terminal 6b, the output terminal 6c, and the gate control terminals 9a to 9f may be joined to the external printed circuit board 20 via a joining material such as solder.

Also, the configurations disclosed by the embodiments can be appropriately combined to the extent that the combination does not cause contradiction. Thus, the present invention naturally includes various embodiments and the like that are not described here. Therefore, the technical scope of the present invention is defined only by the matters specifying the invention according to the valid scope of claims based on the above description. It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor module that includes:
      an insulating circuit board,
      a semiconductor chip provided on a main surface of the insulating circuit board, and
      an external connection terminal provided on the main surface of the insulating circuit board;
   an external printed circuit board provided so as to face a main surface of the semiconductor module, the external printed circuit board having a through hole into which the external connection terminal is inserted; and
   an elastic member provided between the main surface of the semiconductor module and the external printed circuit board so as to apply a pressing force to the main surface of the semiconductor module.

2. The semiconductor device according to claim 1, wherein the external connection terminal is a press-fit terminal, and is press-fitted into the through hole of the external printed circuit board.

3. The semiconductor device according to claim 1, wherein said elastic member is made of a circular-cylindrical elastomer.

4. The semiconductor device according to claim 1,
   wherein the main surface of the semiconductor module is rectangular in a plan view, and
   wherein the elastic member is provided in a central portion in a longitudinal direction of the semiconductor module in the plan view.

5. The semiconductor device according to claim 4, wherein the elastic member extends parallel to a transverse direction of the semiconductor module.

6. The semiconductor device according to claim 5,
   wherein the external connection terminal is provided in a central portion in the longitudinal direction of the semiconductor module, and
   wherein the elastic member is provided in a pair and the pair of the elastic members are provided so as to sandwich the external connection terminal in a plan view.

7. The semiconductor device according to claim 1, further comprising a cooler attached to another main surface of the semiconductor module that is opposite to said main surface via a compound.

8. The semiconductor device according to claim 7, further comprising a fixing portion that fixes the external printed circuit board to said cooler.

9. The semiconductor device according to claim 1, wherein the semiconductor module further comprises a sealing member that seals the semiconductor chip.

10. The semiconductor device according to claim 1, wherein the semiconductor module further comprises an internal printed circuit board so as to face the semiconductor chip on the main surface of the insulating circuit board, the internal printed circuit board being electrically connected to the semiconductor chip.

11. The semiconductor device according to claim 2, further comprising a cooler attached to another main surface of the semiconductor module that is opposite to said main surface via a compound.

12. The semiconductor device according to claim 11, further comprising a fixing portion that fixes the external printed circuit board to said cooler.

13. The semiconductor device according to claim 12, wherein the semiconductor module further comprises a sealing member that seals the semiconductor chip.

14. The semiconductor device according to claim 13, wherein the semiconductor module further comprises an internal printed circuit board so as to face the semiconductor chip on the main surface of the insulating circuit board, the internal printed circuit board being electrically connected to the semiconductor chip and being sealed by the sealing member.

* * * * *